United States Patent
Wu et al.

(10) Patent No.: US 9,882,583 B2
(45) Date of Patent: Jan. 30, 2018

(54) VLSI EFFICIENT HUFFMAN ENCODING APPARATUS AND METHOD

(71) Applicant: Tidal Systems, Inc., Santa Clara, CA (US)

(72) Inventors: Yingquan Wu, Palo Alto, CA (US); Alexander Hubris, San Jose, CA (US)

(73) Assignee: Tidal Systems, Inc., Santa Clara, CA (US)

( * ) Notice: Subject to any disclaimer, the term of this patent is extended or adjusted under 35 U.S.C. 154(b) by 0 days.

(21) Appl. No.: 15/130,054

(22) Filed: Apr. 15, 2016

(65) Prior Publication Data
US 2016/0233881 A1    Aug. 11, 2016

Related U.S. Application Data

(62) Division of application No. 14/299,990, filed on Jun. 9, 2014, now Pat. No. 9,337,862.

(51) Int. Cl.
*H03M 7/40* (2006.01)
*H03M 7/30* (2006.01)

(52) U.S. Cl.
CPC .......... *H03M 7/40* (2013.01); *H03M 7/3084* (2013.01)

(58) Field of Classification Search
CPC .... H03M 7/40; H03M 7/3086; H03M 7/3084; H03M 7/42; H03M 7/30; H03M 7/6017; H03M 7/4006; H03M 7/4031; H03M 7/4043; H03M 7/6011; H03M 7/6058
USPC .............. 341/51, 65, 67, 106, 107
See application file for complete search history.

(56) References Cited

U.S. PATENT DOCUMENTS

| | | | | |
|---|---|---|---|---|
| 5,521,597 | A | * | 5/1996 | Dimitri ............... H03M 7/3086 341/51 |
| 5,933,105 | A | | 8/1999 | Cho |
| 6,563,440 | B1 | | 5/2003 | Kangas |
| 6,919,826 | B1 | | 7/2005 | Peacock |
| 7,415,154 | B2 | | 8/2008 | Hoogendijk |

(Continued)

OTHER PUBLICATIONS

Debray, et al. "ProfileGuided Code Compression." Jun. 17-19, 2002 Berline, Germany http://ftp.cs.arizona.edu/~debray/publications/profcompact.pdf.

(Continued)

*Primary Examiner* — Linh Nguyen
(74) *Attorney, Agent, or Firm* — Brooks, Cameron & Huebsch, PLLC

(57) ABSTRACT

A compression algorithm based on Huffman coding is disclosed that is adapted to be readily implemented using VLSI design. A data file may be processed to replace duplicate data with a copy commands including an offset and length, such as according to the LV algorithm. A Huffman code may then be generated for parts of the file. The Huffman code may be generated according to a novel method that generates Huffman code lengths for literals in a data file without first sorting the literal statistics. The Huffman code lengths may be constrained to be no longer than a maximum length and the Huffman code may be modified to provide an acceptable overflow probability and be in canonical order. Literals, offsets, and lengths may be separately encoded. The different values for these data sets may be assigned to a limited number of bins for purpose of generating usage statistics used for generating Huffman codes.

10 Claims, 5 Drawing Sheets

(56) References Cited

U.S. PATENT DOCUMENTS

| | | | |
|---|---|---|---|
| 7,827,237 B2* | 11/2010 | Plamondon | H03M 7/30 341/87 |
| 7,924,180 B2 | 4/2011 | Chang | |
| 8,063,799 B2* | 11/2011 | Samuels | H03M 7/3084 341/87 |
| 8,253,608 B2* | 8/2012 | Hughes | H03M 7/3086 341/51 |
| 8,306,108 B2* | 11/2012 | Lu | H03M 7/425 375/240.02 |
| 8,593,308 B1* | 11/2013 | Biran | H03M 7/425 341/106 |
| 8,775,663 B1* | 7/2014 | Singh | H04L 29/0604 709/227 |
| 2001/0043745 A1* | 11/2001 | Friederich | G06T 9/005 382/232 |
| 2002/0154040 A1* | 10/2002 | Vataja | H03M 7/30 341/50 |
| 2003/0210825 A1 | 11/2003 | Friederich et al. | |
| 2004/0013311 A1 | 1/2004 | Hirao | |
| 2008/0111722 A1* | 5/2008 | Reznik | H03M 7/40 341/67 |
| 2009/0210437 A1* | 8/2009 | Kuila | H03M 7/40 |
| 2012/0147971 A1 | 6/2012 | Chien et al. | |
| 2012/0233177 A1 | 9/2012 | Teerlink | |
| 2013/0002458 A1 | 1/2013 | Moriya | |
| 2013/0027230 A1 | 1/2013 | Marpe et al. | |
| 2013/0099947 A1 | 4/2013 | Dickie et al. | |
| 2013/0290615 A1* | 10/2013 | Shah | G06F 3/0608 711/103 |
| 2014/0104084 A1* | 4/2014 | Cohen | H03M 7/3084 341/87 |
| 2014/0104085 A1* | 4/2014 | Cohen | H03M 7/3086 341/87 |
| 2014/0140400 A1 | 5/2014 | George et al. | |

OTHER PUBLICATIONS

Lin, et al. "A loseless data compression and decompression algorithm and its hardware architecture" IEEE Transactions on Very Large Scale Inegration (VLSI) Systems, Vo. 14 No. 9, Sep. 2006 http://cadal.cse.nysy.edu.tw/seminar_file_pclee/pdf_1314935885.pdf.

Deutsch, "DEFLATE Compressed Data Format Specification version 1.3". IETF. May 1996. p. 1. sec. Abstract. RFC 1951.

Huffman, "A Method for the Construction of Minimum-Redundancy Codes" Proceedings of the IRE, 1952., pp. 1098-1101.

Larmore, "A Fast Algorithm for Optimal Length-Limited Huffman Codes," Journal of the Association for Computing Machinery, (37) Jul. 3, 1990, 15 pp.

Ziv, "Compression of Individual Sequences via Variable-Rate Coding". IEEE Transactions on Information Theory, vol. 24, No. 5, Sep. 1978, 7 pp.

\* cited by examiner

VLSI EFFICIENT HUFFMAN ENCODING APPARATUS AND METHOD

PRIORITY INFORMATION

This application is a Divisional of U.S. application Ser. No. 14/299,990 filed Jun. 9, 2014, the specification of which is incorporated herein by reference.

BACKGROUND

Field of the Invention

This invention relates to systems and methods for lossless compression of data.

Background of the Invention

Huffman coding is an entropy encoding algorithm used for lossless data compression (see D. A. Huffman, "A method for the construction of minimum-redundancy codes"*Proc. IRE* 40 (9). pp. 1098-1101. 1952). Huffman coding refers to the use of a variable-length code table for encoding a source literal (such as a character in a file) where the variable-length code table has been derived in a particular way based on the estimated probability of occurrence for each possible value of the source literal. Huffman coding uses a specific method for choosing the representation for each literal, resulting in a prefix code (sometimes called "prefix-free codes", that is, the bit string representing some particular literal is never a prefix of the bit string representing any other literal) that expresses the most common source literals using shorter strings of bits than are used for less common source literals. Huffman was able to design the most efficient compression method of this type: no other mapping of individual source literals to unique strings of bits will produce a smaller average output size when the actual literal frequencies agree with those used to create the code. The pseudo code of the Huffman algorithm is described below.

Algorithm 1: Compute Binary Huffman Code
Input: Set of N pairs of (literal, count/probability).
Output: Set of N pairs of (literal, hufcode).
1—Sort the literal ensemble by decreasing count.
2—Select the 2 least probable literals, and assign each a bit 0 and 1, respectively.
3—Substitute the selected literals by a composite literal summing their count, and re-order it.
4—While there remains more than one literal, do steps through 6.
5—Select two least probable literals, and append 0 and 1 respectively.
6—Substitute the selected literals by a composite literal summing their counts, and re-order it.
7—The hufcode of each literal is given by the concatenation of the aggregate bits.

The above Huffman tree introduces two critical inefficiencies into an implementation of the coding scheme. Firstly, each node of the tree must store either references to its child nodes or the literal that it represents. This is expensive in memory usage and if there are a high proportion of unique literals in the source data then total the size of the code tree can account for a significant amount of the overall encoded data. Secondly, traversing the tree is computationally costly, since it requires the algorithm to jump randomly through the structure in memory as each bit in the encoded data is read in.

Canonical Huffman codes address these two issues by generating the codes in a clear standardized format; all the codes for a given length are assigned their values sequentially. This means that instead of storing the structure of the code tree for decompression only the lengths of the codes are required, reducing the size of the encoded data. Additionally, because the codes are sequential, the decoding algorithm can be dramatically simplified so that it is computationally efficient.

Given a list of literals sorted by Huffman code length (denoted by L) in increasing order, the following pseudo code will print a canonical Huffman code book:

---
Algorithm 2: Compute Canonical Huffman Code through its Bit Length

Input: Sorted $(S_i, L_i)$, i = 0,1,2,...,N − 1
Output: Sorted $(S_i, C_i)$, i = 0,1,2,...,N − 1
Set $C_0 = 0$
For i = 0,1,...,N − 2, do:
  Set $C_{i+1} = (C_i + 1) \square (L_{i+1} - L_i)$

---

Software compression is very well understood and the source code for programs like GZIP are readily accessible in the public domain. The algorithm to implement compression is relatively complex to do in hardware for high bandwidth application given that the GZIP compression is based on the DEFLATE algorithm and Huffman coding (*DEFLATE Compressed Data Format Specification version* 1.3. IETF. May 1996. p. 1. sec. Abstract. RFC 1951. Retrieved 11 Nov. 2012). The idea behind compression is to use copy commands later in a data stream that appears earlier in the data stream. As such all compression implementations require a search history buffer and some type of compare length function to determine the longest length that can be used for the copy command. One method to implement the search matching in the previous history is to implement a hash function, which maps the variable length string to fixed value, which can be used to compare the data stream being compressed. The data is hashed and compared to generate a copy or literal command per Lempel-Ziv algorithm or comparable algorithm (Ziv, J.; Lempel, A. (1978). "Compression of individual sequences via variable-rate coding". *IEEE Transactions on Information Theory* 24 (5): 530). Once the statistics for the data to be compressed are gathered, they are then Huffman encoded and then compressed to be sent out.

Huffman coding is not a simple algorithm to implement in hardware as outlined above. The systems and methods disclosed herein provide an improved approach for implementing canonical Huffman coding using very large scale integration (VLSI) circuits.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
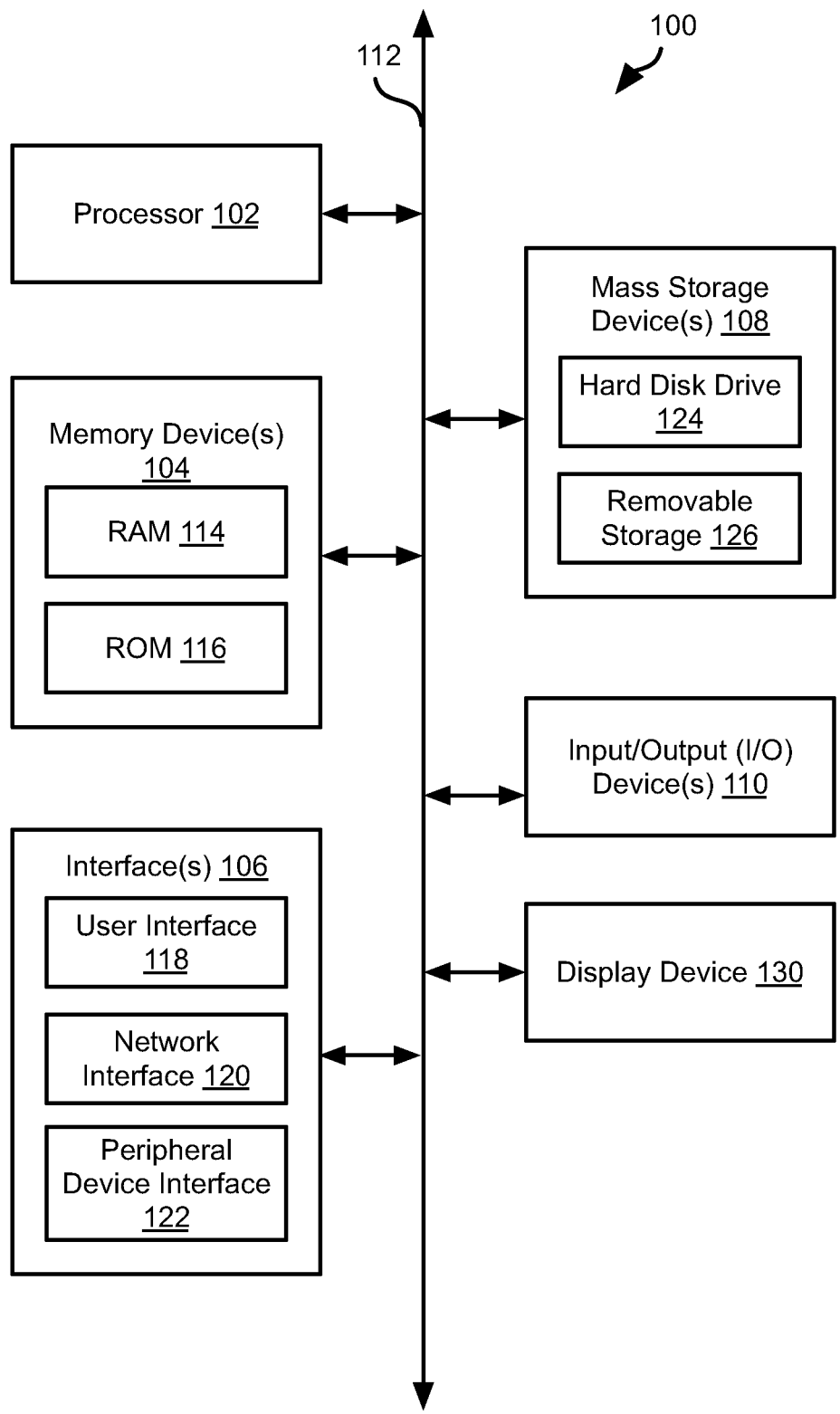
FIG. 1 is a schematic block diagram of a computer system suitable for implementing methods in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the invention has been developed to provide apparatus and methods performing Huffman encoding that is well suited for VLSI implementation.

It is well understood that, using canonical Huffman code, it suffices to transmit the Huffman code lengths for the decompressor to reconstruct Huffman tree, and moreover, the construction algorithm can be easily implemented, as discussed in the Background section. The systems and methods below provide an improved implementation of computing Huffman code length in this section. In particular, the disclosed systems and methods have two aspects. The first aspect transforms the Huffman algorithm to be more readily implemented using very large scale integration (VLSI) design. A second aspect derives a hardware amenable algorithm to limit the maximum Huffman length (so as to limit the number of bits to transmit the Huffman code lengths).

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized, including non-transitory media. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device can perform various monitoring functions as discussed herein, and can execute one or more application programs, such as the application programs described herein. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). Memory device(s) 104 may also include rewritable ROM, such as Flash memory.

Mass storage device(s) 108 include various computer readable media, such as magnetic tapes, magnetic disks, optical disks, solid-state memory (e.g., Flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

Interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

There are two sorting operations in the original Huffman algorithm. First, literals are sorted in decreasing order of count, and then step-wise re-orders messages based upon the combined count of the least two. This is undesirable as each requires dedicated hardware design. Equivalently, it suffices to determine the two least probable messages step-wise, so that both sorting operations are eliminated. Moreover, there is a hidden scenario where some messages may have zero count. These messages need to be precluded from Huffman coding. A natural way is to first preclude those absent messages and then carry out the Huffman algorithm. This, however, takes extra step for preclusion, and the original sequence of literals is (arbitrarily) shortened (entailing a dedicated memory to store it).

In some embodiments, a simpler and homogeneous way is to avoid picking zero count when determining two least counts. The pseudo code is given below ---
Algorithm 3: Computing Huffman Code Lengths
---
Input: $(S_i, P_i)$, $i = 0, 1, 2, \ldots, N - 1$
Output: $(S_i, L_i)$, $i = 0, 1, 2, \ldots, N - 1$
1. Set $L_i = 0$, $I_i = i$, $i = 0, 1, 2, \ldots, N - 1$
2. For $r = 0, 1, 2, \ldots, N - 2$, do:

3. $m_1 = \underset{i<N}{\arg\min}\{P_i > 0\}$, $m_2 = \underset{i<N, i \neq m_1}{\arg\min}\{P_i > 0\}$ 4. If $m_2 = \infty$, then
   5. If $m_1 \neq \infty$ & $r = 0$, then $L_{m_1} = 1$
   6. Early termination
7. $P_{m_1} \leftarrow P_{m_1} + P_{m_2}$, $P_{m_2} \leftarrow 0$
8. If $I_i = m_2$, then $I_i = m_1$, $i = 0, 1, 2, \ldots, N - 1$
9. If $I_i = m_1$, then $L_i \leftarrow L_i + 1$, $i = 0, 1, 2, \ldots, N - 1$

---

Where Si is a literal, Pi is the count (e.g. probability) for literal Si, Li is the bit length for literal Li, Ii is a map value for Li 7 bit code created one by one. On each iteration, two count values are merged, and their map values are likewise merged and set equal to one another. For example, once can create values of 0 and 1. In a next round merged counts and maps may be merged with the count and map value for another literal or another set of merged values. On each iteration, another bit is assigned to the literals or merged values having the two lowest counts. Effectively, one begins at the left and proceeds merging values. After merging, a map value Ii represents an entire branch of a tree. When the bit length for a map value Ii is incremented, the bit lengths of all code lengths having that value are incremented.

Upon computing optimal Huffman code lengths, we proceed to enforce length limitation. Let L be the maximum allowed length. We first check and enforce the length limitation If $L_i > L$, then set $L_i \leftarrow L$, $i=0,1,2,\ldots,N-1$.

Denote by $P_o$ the overflow probability scaled by a factor of $2^L$, mathematically $$P_o = \sum_{i=0}^{N-1} 2^{L-L_i} - 2^L.$$

A positive overflow probability indicates that the resulting Huffman lengths are invalid and need to revised, by increasing some lengths, to make it non-positive (zero is optimal).

We then sort the lengths $L_i$, i=0,1,2, ... N−1, firstly by increasing length values and secondly by increasing alphabetic order (when lengths are equal). This immediately enables to construct canonical Huffman codes (Algorithm 2). Noting that the maximum length satisfies L=O(log N), the sorting can be implemented more efficiently by the following.

---
Algorithm 4: Sort of Huffman Lengths in Increasing Order

```
n = 0;
for(l = 1;  l ≤ L;  l ← l + 1)
    for(i = 0;  i < N;  i ← i + 1)
        if( l = L_i ) {
            S̃_n = S_i;  L̃_n = l;
            n ← n + 1;  }
```
---

In L. L. Larmore and D. S. Hirschberg, "A fast algorithm for optimal length-limited Huffman codes," Journal of the Association for Computing Machinery, (37)3, pp. 464-473, Jul. 1990, the authors proposed a fast algorithm to compute optimal length-limited Huffman codes with time complexity O(LN) and space complexity O(N) The algorithm, however, is still too complex to be implemented in hardware. We next propose a suboptimal algorithm to reduce $P_o$ to non-positive, while maintaining the sorted order (so that canonical Huffman codes can be readily constructed). The idea is to find the latest length such that increasing it by one releases (barely) enough probability to subdue $P_o$. The algorithmic procedure is given below with respect to FIG. 4.

---
Algorithm 5: Suboptimal Construction of Length-Limited Huffman Codes

```
i = 0;  while(2^{L−1−L̃_i} ≥ P_o) { i ← i + 1; }
j ← i − 1;  L̃_j ← L̃_j + 1;
s ← S̃_j;
while(L̃_i = L̃_j & s > S̃_i) { S̃_{i−1} ← S̃_i;  i ← i + 1; }
S̃_{i−1} ← s
```
---

Note the second part of the above Algorithm 5 inserts the literal with increased length $\tilde{L}_j+1$ to enforce proper alphabetical order among literals with equal length. Since Algorithm 5 suppresses the overflow probability, at the same time keeps the literals in order, Algorithm 2 in preceding section is readily deployed to compute the corresponding canonical Huffman codes.

Figure 2:
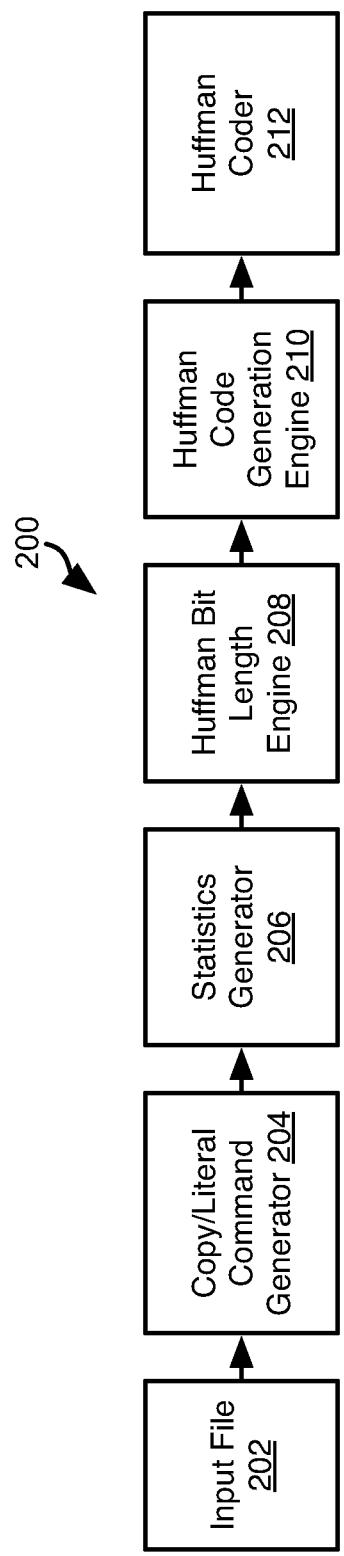
FIG. 2 is a schematic block diagram of components for VLSI efficient implementation of Huffman encoding in accordance with an embodiment of the present invention.

Referring to FIG. 2, the algorithms above may be implanted using the illustrated modules either as separate electronic components or software modules. As noted above, the methods described herein are readily implemented using VLSI design techniques.

An input file 202 may be input into a copy/literal command generator 204. The copy/literal commands may be generated according to a conventional duplicate string elimination algorithm, such as the LZ77 (Lempel and Ziv) or LZ78 algorithm. As known in the art, duplicate string elimination processes literals of a file. If string of literals (one or more) is found to be preceded in the file by an identical string of literals, the string of literals is replaced with a flag indicating it is a copy as well as a length indicating the number of literals in the string and an offset indicating how far back in the file to the beginning (or end) of the identical string of literals. A literal that is not preceded in the file by an identical literal may be flagged in a different manner such as a "literal" flag. In some instances, literals are flagged with a one bit and the copies are flagged with a zero bit, or vice-versa.

The input file 202 as processed to include the copy/literal commands by the copy/literal command generator 204 (the "processed file") may be input to a statistics generator 206. The statistics generator counts the number of instances of each literal represented in processed file. In some embodiments, separate sets of usage statistics may be generated for different types of data. For example, usage statistics may be determined for each literal command (e.g. count the number of occurrences of each literal flagged as a literal. Usage statistics may be determined for each copy command. Separate sets of usage statistics may be determined for the length values (e.g. count the number of occurrences of each length value represented) and the offset values of the copy commands (e.g. count the number of occurrences of each offset value represented).

For example, statistics may be gathered for the LZ commands consisting of the FlagRun, Offset, Length and Literal. The FlagRun command may be a command that indicates that N of the following bytes are should be treated as literals, thereby eliminating the need to flag each literal as a "literal." The FlagRun command may be assigned as described in U.S. application Ser. No. 14/274,364, filed May 9, 2014, and entitled IMPROVED DEFLATE COMPRESSION ALGORITHM.

The statistics can be gathered in many different bins for the dynamic Huffman Encoding. In some embodiments, the statistics gathered for each LZ command are limited to at most 16 bins.

The statistics are gathered to generate a dynamic Huffman Codes used to compress the data stream. The dynamic Huffman Code is generated using a two stage engine as shown in FIG. 2. The first engine (Huffman bit length engine 208) generates the Huffman bit lengths which will be sent as part of the compression header for decompression. The second engine (Huffman code generation engine) enforces a Huffman tree code length so that it is not longer than N bits long (e.g. 7, 15, 31, or some other value) even though the tree depth can be more than N bits long for the dynamic Huffman coding.

The canonical Huffman code output by the Huffman code generation engine 210 may be input with the processed file to a Huffman coder 212, which performs Huffman coding of the processed file using the canonical Huffman code to produce a compressed output file.

Figure 3:
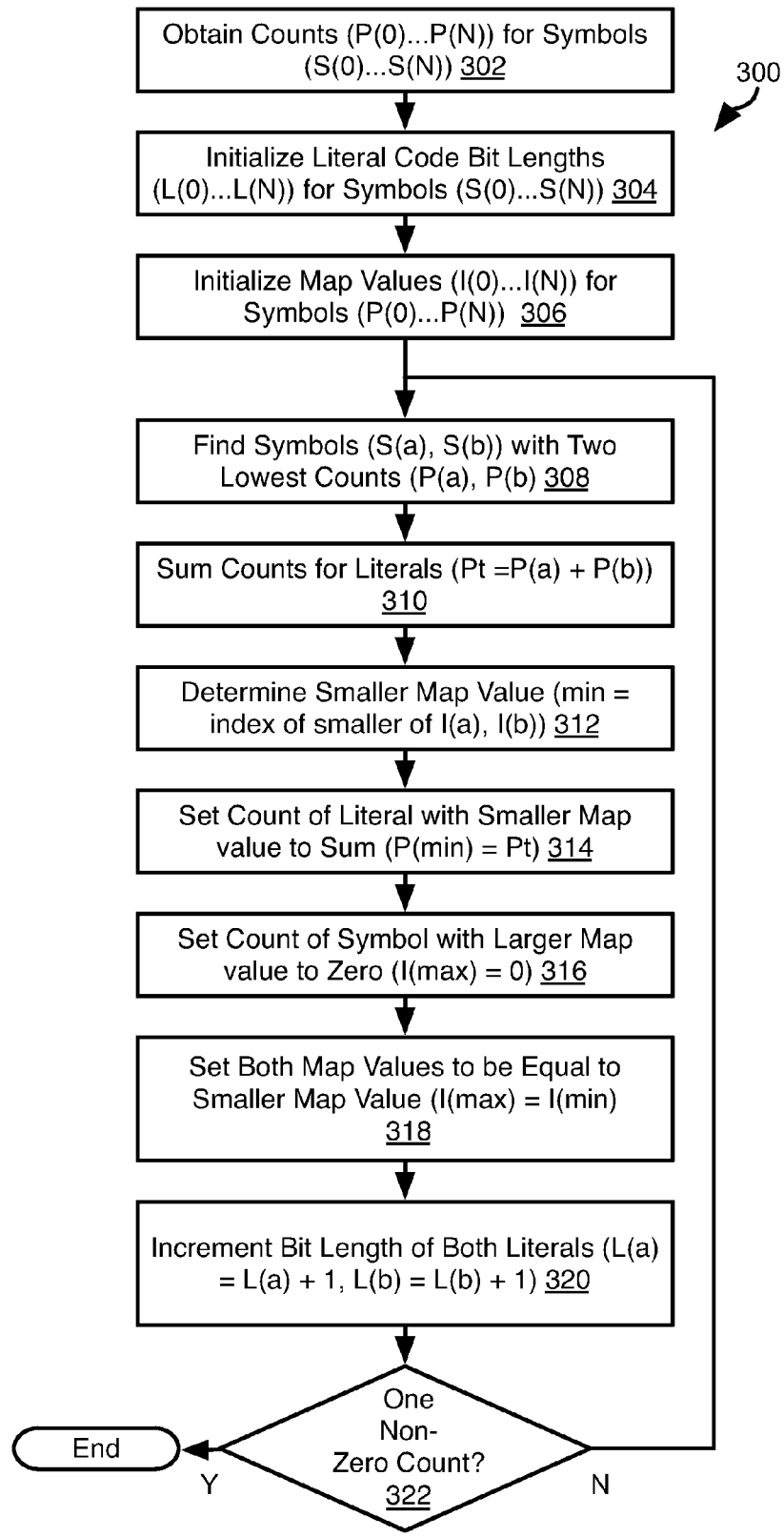
FIG. 3 is a process flow diagram of a method simultaneously sorting and generating Huffman code lengths for an input file in accordance with an embodiment of the present invention.

The Huffman Bits Length Engine 208 may perform the method 300 of FIG. 3. The conventional approach for generating the canonical Huffman bit lengths is to sort all the data. The method 300 does not require the sorting first. The hardware may therefore be simplified to only find the lowest to nodes at each iteration while the Huffman bit lengths are being generated. The map values alluded in the flow chart refer to the element that is being Huffman coded meaning it can be literal, offset, flagRun, or length. The count refers to the frequency count of the map values to be Huffman coded.

The method 300 may include obtaining 302 counts P(0) to P(N) for each symbol S(0) to S(N), respectively, of a data set (literal, flagRun, offset, or length). Each count P(i) represents the number of occurrences of symbol S(i) in the data set. Bit lengths L(0) to L(N) for each symbol S(0) to S(N), respectively, may be initialized 304 to zero and invalid entries may be removed. Invalid entries may be symbols S(i) having corresponding counts P(i) equal to zero. For the remainder of the method 300, the symbols S(0) to S(N) considered may include only those that are valid, i.e. have a non-zero count P(0) to P(N). Likewise, map values I(0) to I(N) for each symbol S(0) to S(N), respectively, may be initialized 306. Initializing the map values I(0) to I(N) may include setting each map value I(i) equal to i, i=0 to N.

The method 300 may then include finding 308 two symbols S(a) and S(b) having the two lowest corresponding counts P(a) and P(b). The sum of these counts Pt=P(a)+P(b) may then be determined 310. The symbol S(min) of the symbols S(a) and S(b) having the smallest map value I(a), I(b) may also be determined 312. The count P(min) corresponding to the smaller map value may be set 314 equal to the sum of the counts (Pt). The count P(max) of the symbol S(max) of the symbols S(a), S(b) having the largest map value I(a), I(b) may be set 316 equal to zero. The map values I(a) and I(b) may both be set 318 to be equal to the smaller map value, i.e. I(max) may be set equal to I(min). Although both map values I(a) and I(b) for both counts P(a) and P(b) are set equal to the smaller map value in this embodiment, in other embodiments, the map value to which I(a) and I(b) are set equal may be either map value selected in any manner provided they are equal to one another. Likewise, whichever map value is selected, the count P(i) corresponding to the selected map value I(i) may be set equal to Pt.

The bit lengths L(a) and L(b) corresponding to both symbols S(a) and S(b) may be incremented 320 by one. In subsequent iterations, one or both of the counts P(a) and P(b) may correspond to one or more literals that have been previously processed. Accordingly, the bit lengths L(i) of all symbols S(i) having a map value I(i) matching either of the map values I(a) or I(b) may be incremented 320 in subsequent iterations of steps 308-322.

The method 300 may then include determining 322 whether all of the counts P(0) to P(N) I(0) are equal to zero. If not, the method continues at step 308. If so, then the method 300 may end. In some embodiments, rather than determining whether all counts are equal to zero, step 322 may include evaluating a counter to determine whether all non-zero counts have been processed, the counter being incremented upon each iteration of steps 308-322 or initialized to the number of non-zero counts and decremented upon each iteration of steps 308-322.

The bit lengths L(0) to L(N) as determined according to the method 300 may then be sorted into canonical order and stored as a header of a compressed file for use by a decompression engine to decompress a data file. The bit lengths L(0) to L(N) are also used to compress the data file according to conventional Huffman coding using a canonical Huffman code.

The bit lengths L(0) to L(N) determined according to the method 400 may then be processed further in order to limit the length of the bit lengths to some fixed value Lmax. For example, Lmax may be equal to 7 bits.

Figure 4:
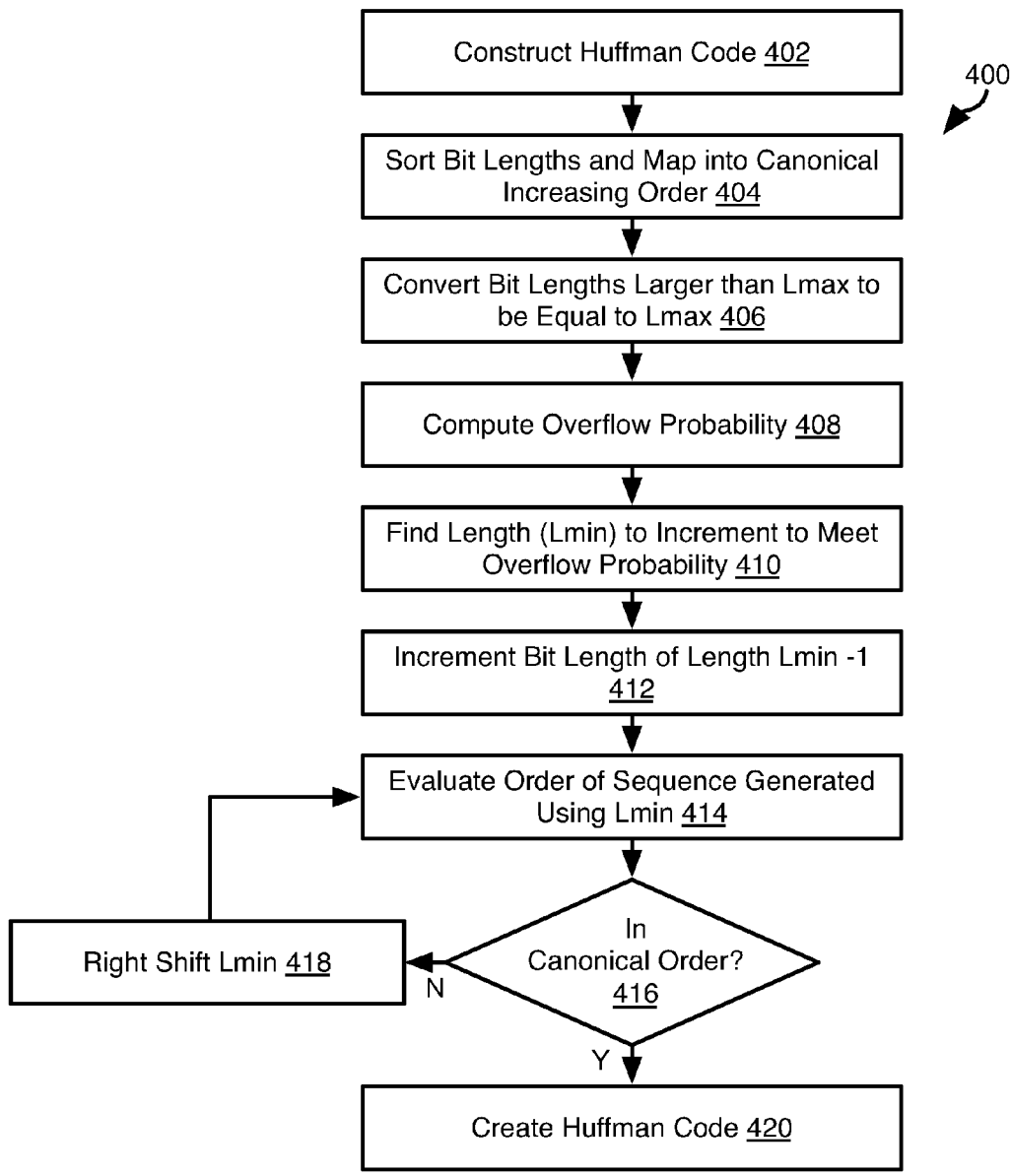
FIG. 4 is a process flow diagram of a method for normalizing canonical Huffman bit lengths to a specified length in accordance with an embodiment of the present invention.

FIG. 4 illustrates an example method 400 for limiting the length of Huffman codes. The method 400 may include constructing 402 Huffman codes without length limitation and sorting 404 the Huffman codes into canonical order, such as performing generation and sorting simultaneously using the method 300 or a conventional approach in which codes are generated and sorted in separate steps.

Bit lengths larger than Lmax are converted 406 to Lmax. For example, each bit length L(i) having an original value greater than Lmax (e.g. 7) may be set equal to 7 (L(i)=Lmax).

The overflow probability for the bit lengths L(0) to L(N) as limited at step 406 may then be computed 408. The overflow probability Po may be computed as $$P_o = \sum_{i=0}^{N-1} 2^{Lmax-L(i)} - 2^{Lmax}.$$

A length Lmin may then be found 410 that, when incremented, causes the overflow probability to be less than zero. As noted above, a positive overflow probability indicates that a Huffman code is invalid. In particular, Lmin may be the largest bit length L(i) that when incremented by one causes the overflow probability to change from positive to less than or equal to zero. A second bit length L(j)=Lmin−1 may then be incremented 412. In some instances there may be multiple bit lengths L(i) having equal lengths. In this case, the bit lengths of equal length may be arranged alphabetically in list of bite lengths. Accordingly, the second bit length L(j)=Lmin−1 that is incremented may be selected as the last bit length equal to Lmin−1.

As noted above, in the canonical ordering, bit lengths of equal lengths are ordered alphabetically. Accordingly, the method 400 may include evaluating 414 whether L(j) is no longer in canonical order. If L(j) is not found 416 to be in canonical order it may be shifted 418 to the right. For example, assume the bit lengths before incrementing are in the order L('B')=4, L('E')=4, and L('A')=5. If L('E') is incremented to be 5, the ordering will now be L('B')=4, L('E')=5, and L('A')=5. L('E') and L('A') are no longer in canonical order. Accordingly, right shifting 418 may include shifting L('E') to the right such that the ordering is now L('B')=4, L('A')=5, and L('E')=5. The right shifting may continue until the incremented bit length B(j) is in the canonical order.

The bit lengths L(0) to L(N) ordered in canonical order may then be used to create 420 the correct codes, such as according to Algorithm 2.

Figure 5:
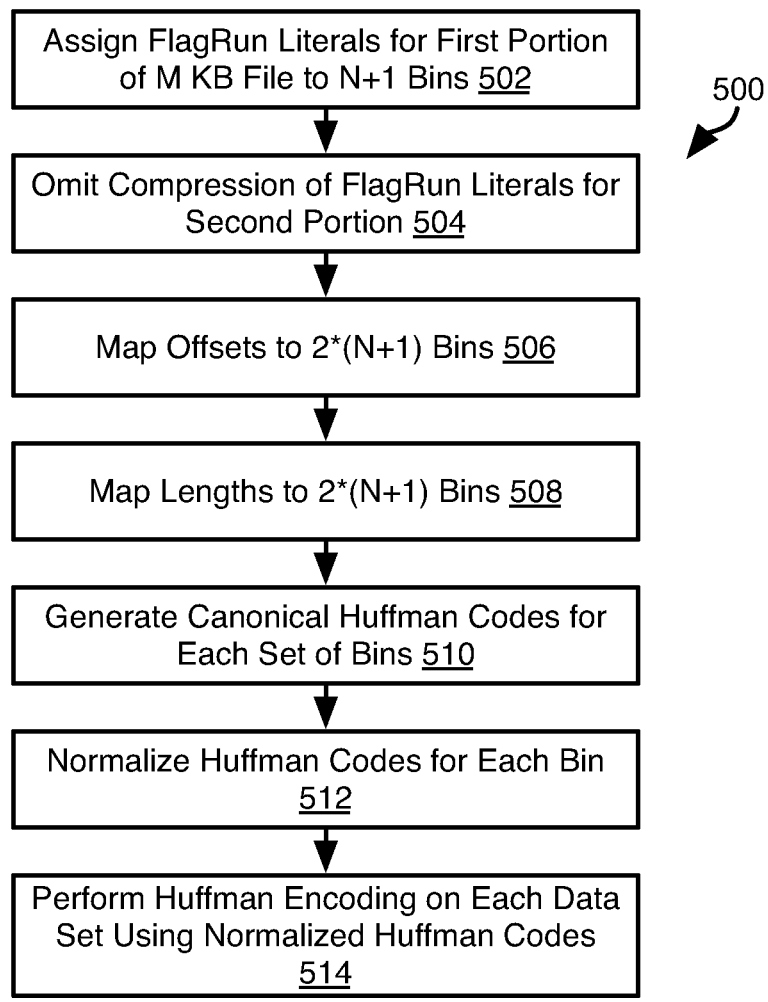
FIG. 5 is a process flow diagram of a method for Huffman encoding a data file in accordance with an embodiment of the present invention.

Referring to FIG. 5, as noted above, when generating a dynamic Huffman code for the symbols of dataset (flagrun, offset, length, literal) the number of bins in which usage statistics may be accumulated may be limited. To facilitate this, symbols encoded as bytes may be treated as two 4 bit quantities labeled as MSBHufflits (most significant four bits) and LSBHuffLits (least significant four bits). This guarantees that the total bits for the literal statistics gathered will only complete fit in 16 binning statistics.

A method 500 for encoding a processed file may include assigning flagRun literals to bins for only a first portion of a M kB file to N+1 bins, where N is the maximum Huffman code length imposed according to the method 400. For example, a flagRun values from 1 to 8 literals will be assigned to bins 0 to 7 as shown in Table 1, below. The method 500 may include omitting 504 compression of flagRun literals for a second portion of a data file, which may include omitting counting flagRun literals for the second portion of the data file.

TABLE 1

| FlagRun Bins | |
|---|---|
| FlagRun Bin | # of literals |
| 0 | 1 |
| 1 | 2 |
| 2 | 3 |
| 3 | 4 |
| 4 | 5 |
| 5 | 6 |

TABLE 1-continued

FlagRun Bins

| FlagRun Bin | # of literals |
|---|---|
| 6 | 7 |
| 7 | 8 |

FlagRun symbols in a second portion of a file, e.g. a second half, may be Huffman coded. For example, the flagRun literals can be dynamically coded using an average formula of literals versus copy commands or some other formulate rather than just half of the compression coding frame, or it can be dynamically coded for a fixed percentage of the compression frame other than half.

The method 500 may include mapping 506 the offset values to a fixed number of bins, such as 2*(N+1) bins, or 16 bins for N=7. For example, the Offset Map may consist of 16 bins for the statistics gathering segmented according to Table 2. In some embodiments, for the offset binning, the "same as last copy offset" can use another binning value other than 0 such as 15 or any number in between. Likewise, The bin used for 'Dictionary' copy may use some other bin value than 0.

TABLE 2

| Offset Bin | Extended Bits | Offset Range |
|---|---|---|
| 0 | 0 | Same as last copy Offset |
| 1 | 4 | 0-15 |
| 2 | 4 | 16-31 |
| 3 | 5 | 32-63 |
| 4 | 5 | 64-95 |
| 5 | 5 | 96-127 |
| 6 | 6 | 128-191 |
| 7 | 6 | 192-255 |
| 8 | 7 | 256-383 |
| 9 | 7 | 384-511 |
| 10 | 8 | 512-767 |
| 11 | 8 | 768-1023 |
| 12 | 9 | 1024-1535 |
| 13 | 9 | 1536-2047 |
| 14 | 10 | 2048-3071 |
| 15 | 10 | 3072-4095 |

Offset Bin Mapping

As is readily apparent, the number of possible values for the offset greatly exceeds the number of bins. However, as noted above, constraining the offset values to a fixed number of bins enables the offset values to be dynamically Huffman coded using a VLSI device.

The method 500 may include mapping 508 length values to 2*(N+1) bins or 16 bins for N=7. For example, length values may be assigned to one of 16 bins according to Table 3.

TABLE 3

Length Bin Mapping

| Length Bin | Length Definition |
|---|---|
| 0 | Dictionary |
| 1 | 2 |
| 2 | 3 |
| 3 | 4 |

TABLE 3-continued

Length Bin Mapping

| Length Bin | Length Definition |
|---|---|
| 4 | 5 |
| 5 | 6 |
| 6 | 7 |
| 7 | 8 |
| 8 | 9 |
| 9 | 10 |
| 10 | 11 |
| 11 | 12 |
| 12 | 13 |
| 13 | 14 |
| 14 | 15 |
| 15 | 16 |

The method 500 may include mapping 508 length values to 2*(N+1) bins or 16 bins for N=7. For example, length values may be assigned to one of 16 bins according to Table 3.

The method 500 may include generating 510 canonical Huffman codes for each set of bins. For example, for the counts for each set of bins (flagRun, length, offset, and literal) a canonical Huffman code may be generated according to the method 300. The Huffman codes generated at step 510 may then be Normalized 512. Normalizaiton may include transforming the Huffman codes such that the bit lengths are not greater than N according to the method 400 of FIG. 4. The symbols of each data set (flagRun, length, offset, and literal) may then be Huffman encoded 514 using the Huffman codes determined for each data set at step 512.

The Huffman encoded data sets may be written to an output stream and transmitted to a receiving device with a header including the Huffman codes used to encode each data set. The output stream or output file for an input data file may be written in the form of a Header Tree Header which is 6 bytes long for the Huffman code determined for each of the MSB of literals, LSB of literals, lengths, offsets. The Header Tree Header may be 3 bytes long for the flagRun for literals, i.e. because for 7 bits, only three bytes are needed.

In the example, above, an input data file of 4K bytes, however other file sizes may be used, such as 8K, 16K, 32K, 64K, or some other size. Likewise, rather than limiting the code length to 7 bits, the code lengths may be limited to some other value, such as 15 bits, 31 bits, or some other value, which may depend on the size of the input file. Likewise, a partial mapping may be performed of an offset values table for copy command for a 4K Offset. Likewise, dynamic Huffman coding of literal commands for 2K bytes of a 4K sector may be performed.

The following references are incorporated herein in their entirety:

[1]. D. A. Huffman, "A method for the construction of minimum-redundancy codes" *Proc. IRE* 40 (9). pp. 1098-1101. 1952.

[2]. L. L. Larmore and D. S. Hirschberg, "A fast algorithm for optimal length-limited Huffman codes," Journal of the Association for Computing Machinery, (37)3, pp. 464-473, Jul. 1990.

[3]. *DEFLATE Compressed Data Format Specification version* 1.3. IETF. May 1996. p. 1. sec. Abstract. RFC 1951. Retrieved 11 Nov. 2012.

[4]. Ziv, J.; Lempel, A. (1978). "Compression of individual sequences via variable-rate coding". *IEEE Transactions on Information Theory* 24 (5): 530.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. An electronic device comprising:
   a statistic generating module configured to process a data file and flag each literal as part of one of a plurality of literal groups of one or more non-duplicative literals and one of a plurality of copy groups of one or more literals; and wherein:
      the one or more literals of each literal group not being preceded in the data file by an identical group of one or more literals;
      the one or more literals of each copy group being preceded in the data file by an identical group of one or more literals;
      each copy group having both a length indicating a number of literals in the copy group and an offset to the identical group of one or more literals preceding the each copy group in the data file; and
      each literal group having a length indicating a number of literals in the literal group; and
   a Huffman coding module configured to:
      code a first portion of the plurality of literal groups to obtain Huffman coded literal groups, the portion of the plurality of literal groups being included in a first portion of the data file;
      include the Huffman coded literal groups in an output file; and
      include a second portion of the plurality of literal groups in a second portion of the data file in the output file without Huffman coding the second portion of the plurality of literal groups, the second portion occurring after the first portion in the data file.

2. The electronic device of claim 1, wherein the Huffman coding module is further configured to:
   divide the data file into the first portion and the second portion by evaluating an average number of literal groups with respect to copy groups in the first and second portions.

3. The electronic device of claim 1, wherein:
   the Huffman coding module is further configured to:
      code offsets of a plurality of copy groups to obtain Huffman coded offsets;
      include the Huffman coded offsets in the output file.

4. The electronic device of claim 3, further comprising a length module is configured to:
   separate from the Huffman coding of the offsets of the plurality of copy groups, Huffman code the lengths of the plurality of copy groups to obtain Huffman coded lengths; and
   include the Huffman coded lengths in the output file.

5. The electronic device of claim 3, further comprising a length module is configured to:
   limit a Huffman code length for the Huffman coding of the offsets and the lengths of a plurality of copy literals to N bits.

6. The electronic device of claim 5, wherein N is 8.

7. The electronic device of claim 5, wherein the length module is further configured to:
   for each data set of the lengths and offsets:
      generate a first canonical Huffman code of data words in the each data set, the first canonical Huffman coding including a code length for each data word, the code lengths being arranged in order;
      set all code lengths greater than N to be equal to N to obtain a second canonical Huffman code; and
      determine a benchmark code that is a largest code length lower than N that when incremented by one causes an overflow probability of the second canonical Huffman coding to be greater than or equal to one.

8. The electronic device of claim 7, wherein:
   the length module is further configured to increment an adjusted code by one to generate a third canonical Huffman code, the adjusted code having a length less than the benchmark code; and
   the Huffman coding module further configured to code the data file according to the third canonical Huffman coding.

9. The electronic device of claim 5, wherein the length module is further configured to:
   Huffman code the offsets and the lengths using a very large scale integrated (VLSI) circuit programmed to perform Huffman coding of Huffman codes of N or less.

10. The electronic device of claim 5, wherein the length module is further configured to:
    map lengths from 1 to M to one of 2*N bins, M being greater than 2*N.

* * * * *